United States Patent
Zhou et al.

(10) Patent No.: US 6,534,393 B1
(45) Date of Patent: Mar. 18, 2003

(54) METHOD FOR FABRICATING LOCAL METAL INTERCONNECTIONS WITH LOW CONTACT RESISTANCE AND GATE ELECTRODES WITH IMPROVED ELECTRICAL CONDUCTIVITY

(75) Inventors: Mei Sheng Zhou, Singapore (SG); Vijai Kumar Chhagan, Belgrave (GB); Jian Xun Li, Singapore (SG)

(73) Assignees: Chartered Semiconductor Manufacturing Ltd., Singapore (SG); National University of Singapore, Singapore (SG); Nanyang Technological University of Singapore, Singapore (SG); Institute of Microelectronics, Singapore (SG)

( * ) Notice: Subject to any disclaimer, the term of this patent is extended or adjusted under 35 U.S.C. 154(b) by 0 days.

(21) Appl. No.: 09/236,487

(22) Filed: Jan. 25, 1999

(51) Int. Cl.⁷ ........................................... H01L 21/4763
(52) U.S. Cl. ................. 438/618; 438/197; 438/624; 438/631; 438/598; 438/233; 438/595
(58) Field of Search ................ 438/163, 197, 438/283, 289, 294, 585, 595, 598, 618, 622, 624, 626, 230, 233, 303, 631

(56) References Cited

U.S. PATENT DOCUMENTS

| | | | | |
|---|---|---|---|---|
| 5,268,330 A | | 12/1993 | Givens et al. | 438/516 |
| 5,482,894 A | * | 1/1996 | Havemann | 438/623 |
| 5,532,191 A | * | 7/1996 | Nakano et al. | 438/692 |
| 5,610,083 A | | 3/1997 | Chan et al. | 438/155 |
| 5,683,941 A | | 11/1997 | Kao et al. | 438/592 |
| 5,780,338 A | * | 7/1998 | Jeng et al. | 438/253 |
| 5,811,350 A | * | 9/1998 | Dennison | 438/597 |
| 5,866,448 A | * | 2/1999 | Praddeep et al. | 438/231 |
| 6,071,799 A | * | 6/2000 | Park et al. | 438/595 |
| 6,083,827 A | * | 7/2000 | Lin et al. | 438/631 |

* cited by examiner

Primary Examiner—Amir Zarabian
Assistant Examiner—Maria Guerrero
(74) Attorney, Agent, or Firm—George O. Saile; Rosemary L. S. Pike

(57) ABSTRACT

A method for making low sheet resistance local metal interconnections and improved transistor performance is described. The method involves patterning a polysilicon layer and a silicon nitride ($Si_3N_4$) cap layer over device areas to form FET gate electrodes, and the patterned polysilicon extends over the field oxide regions to form portions of the local interconnections. After forming source/drain areas and sidewall spacers on the FET gate electrodes, a silicon oxide ($SiO_2$) insulating layer is deposited and polished back to the $Si_3N_4$ cap. The $Si_3N_4$ is then selectively removed over the patterned polysilicon layer, leaving recesses in the $SiO_2$ layer. After etching contact openings in the $SiO_2$ layer to the substrate, a high electrically conducting metal layer, having a barrier layer, is deposited and patterned to complete the local interconnections. Portions of the metal are retained in the recesses over the pattered polysilicon layer to improve transistor performance, while portions of the metal in the contact openings provide low-contact resistance to the substrate.

30 Claims, 4 Drawing Sheets

METHOD FOR FABRICATING LOCAL METAL INTERCONNECTIONS WITH LOW CONTACT RESISTANCE AND GATE ELECTRODES WITH IMPROVED ELECTRICAL CONDUCTIVITY

BACKGROUND OF THE INVENTION (1) Field of the Invention

The present invention relates to the fabrication of semiconductor devices on substrates, and more particularly relates to a method for making local metal interconnections that also improves the electrical conductivity of the polysilicon gate electrodes for field effect transistors (FETs) while providing low contact resistance to the underlying silicon substrate.

(2) Description of the Prior Art

Field effect transistors (FETs) are used in the semiconductor industry for Ultra Large Scale Integration (ULSI) circuits. These FETs are commonly formed using patterned conductively doped polysilicon layers for the gate electrodes and diffused self-aligned doped areas in the substrate adjacent to the gate electrodes for the source/drain areas. The polysilicon layers and the source/drain areas, even though conductively doped, have more electrical resistance than metal or metal silicide layers. This higher resistance is generally undesirable because it increases the RC (resistance×capacitance) time delay of the circuit and reduces circuit performance (speed). Therefore, it is a common practice in the industry to use metal silicide on the gate electrodes and local interconnections to improve the circuit performance.

One conventional method of forming the FETs with silicide gate electrodes and source/drain areas is to form the gate electrodes by patterning a multilayer of doped polysilicon, a metal silicide, and a cap oxide layer over the device areas. The gate electrodes are then used as a diffusion or implant barrier mask to form self-aligned lightly doped source/drain areas in the substrate adjacent to the sides of the gate electrodes. Sidewall insulating spacers are formed on the gate electrode sidewalls and a second implant, aligned to the sidewall spacers, is used to form the source/drain contact areas. A metal is deposited and annealed (sintered) to form the silicide source/drain contact areas with low resistance. However, this requires additional etching steps to form the gate electrodes in the multilayer of oxide, silicide, and polysilicon, which also requires reasonably vertical sidewalls for forming the sidewall spacers.

Another method which saves processing steps is the self-aligned silicide (salicide) process in which both the silicide gate electrodes and source/drain areas are made at the same time. In this method the gate electrodes are formed from a single doped polysilicon layer, and after forming insulating sidewall spacers, a single metal, such as titanium (Ti), is deposited and annealed to concurrently form the silicide source/drain areas and silicide gate electrodes. The unreacted Ti on the oxide sidewall spacers and on other oxide surfaces is removed to electrically isolate the silicide source/drain areas from the silicide gate electrodes.

However, as these polysilicon and polycide lines are reduced in width to allow higher circuit density for future integrated circuits, the resistance of the local interconnecting lines (including the gate electrodes) dramatically increases and circuit performance is diminished.

Several methods have been reported in the literature for reducing the polysilicon resistance by forming silicide on the FET gate electrodes and local interconnections.

For example, in U.S. Pat. No. 5,683,941 Kao teaches a method for making a self-aligned silicide on the patterned polysilicon using an overlying insulating layer that is planarized, and then etched back to expose the polysilicon. A metal layer is deposited and reacted with the exposed polysilicon to form the self-aligned polycide pattern. A method for making back-gate contacts for FETs on a silicon-on-insulator (SOI) substrate is described by Chan et al. in U.S. Pat. No. 5,610,083. The method chemically-mechanically polishes back an overlying insulating layer to a polysilicon contact for making electrical contact to the substrate, while concurrently forming the FETs. The method does not address local interconnections. Another method for improving the sheet resistance of an integrated circuit device gate is described by Givens et al. in U.S. Pat. No. 5,268,330. In this invention an insulating layer (doped $SiO_2$) is polished back to a passivation layer ($Si_3N_4$) over the gate electrode. The passivation layer is removed over the gate electrode and a conducting material, such as tungsten, is deposited to make contact to the gate electrode to improve the sheet resistance. However, the invention does not describe the formation of improved metal local interconnections and improved transistor performance.

However, there is still a need in the semiconductor industry to fabricate local interconnections with improved electrical conductivity and improved transistor performance on future integrated circuits, where linewidths of the interconnections will be submicron in dimensions.

SUMMARY OF THE INVENTION

It is therefore a principal object of this invention to form local metal interconnections while improving the contact resistance to the substrate and improving the electrical conductivity of a patterned polysilicon layer that is used to form the FET gate electrodes.

It is another object of this invention to provide these improved contacts and FETs by selectively removing the cap insulating layer over the patterned polysilicon layer that also forms the FET gate electrodes.

Still another objective is to use the patterned metal layer for making the metal interconnections to form metal contacts in the insulating layer on the substrate to further reduce contact resistance.

Another object of this invention is to provide a simple and manufacturable process.

In accordance with the objects of the invention, a method for fabricating improved metal interconnections which also reduces the resistance of the patterned polysilicon layer that also forms the gate electrodes for the FETs. Also, the method concurrently forms metal contacts to the substrate in the insulating layer over the substrate which reduces contact resistance. Although the method is described for an N-channel FET on a P doped substrate, the method also applies to forming P-channel FETs on N doped substrates. Also, the process is compatible with making both P-channel and N-channel FETs, respectively, on doped N-wells and P-wells formed on and in the substrate.

The objectives described above are achieved by providing a semiconductor substrate, such as a single-crystal silicon doped with a P-type dopant, such as boron. Field OXide (FOX) regions are formed in and on the substrate to surround and electrically isolate device areas. The FOX is formed by shallow trench isolation (STI), as commonly used in the industry, and the STI is made planar with the substrate surface. After forming the STI, a gate oxide is formed, for example by thermal oxidation, over the device areas for the FETs. A conductively doped polysilicon layer is deposited on the substrate using low-pressure chemical vapor deposition (LPCVD) and is doped with a conductive dopant such as arsenic (As) or phosphorus (P) using ion implantation. Next a first insulating layer composed of silicon nitride ($Si_3N_4$) is deposited by low-pressure chemical vapor deposition (LPCVD) on the polysilicon layer. The first insulating layer and the polysilicon layer are patterned using a photoresist mask and anisotropic plasma etching. The polysilicon is patterned to form gate electrodes over the device areas and form portions of the local interconnections over the field oxide isolation regions. Lightly doped source/drain areas are formed next by ion implanting an N type dopant adjacent and aligned to the gate electrodes of the N-channel FET. A conformal second insulating layer composed of silicon oxide ($SiO_2$) is deposited by CVD over the gate electrodes and is anisotropically etched back to form sidewall spacers on the sidewalls of the gate electrodes. Source/drain contact areas are then formed by ion implantation adjacent to the sidewall spacers. A third insulating layer composed of $SiO_2$ is deposited on the substrate and is chemically-mechanically polished back to the first insulating layer ($Si_3N_4$) to form a planar surface. By the method of this invention, the $Si_3N_4$ first insulating layer is selectively removed over the patterned polysilicon layer to form recesses in the third insulating layer. The $Si_3N_4$ is selectively removed using, for example, a hot phosphoric acid solution while leaving the second and the third insulating layers essentially unetched. Next, contact openings are etched in the third insulating layer to the substrate using a photoresist mask and anisotropic etching. A blanket metal layer having high electrical conductivity is deposited to fill the contact openings and the recesses in the third insulating layer and to form an essentially planar layer over the substrate. For example, the metal layer can be composed of a barrier layer, such as titanium/titanium nitride (Ti/TiN), and a good electrical conductor such as tungsten, copper, aluminum, platinum, silver, palladium, or the like. Also by the method of this invention, the metal layer is patterned using a photoresist mask and anisotropic plasma etching to complete the local metal interconnections while leaving portions of the metal in the recesses to improve the electrical conductivity of the patterned polysilicon layer.

By a second embodiment of this invention, an additional photoresist mask is used to pattern the $Si_3N_4$ first insulating layer leaving portions over the patterned polysilicon layer to serve as crossovers for the patterned metal local interconnections. The $Si_3N_4$ can be etched using plasma etching in a gas that etches $Si_3N_4$ selectively.

BRIEF DESCRIPTION OF THE DRAWINGS

The objects and other advantages of the invention are best understood with reference to the embodiments and in conjunction with the following drawings.

DESCRIPTION OF THE PREFERRED EMBODIMENTS

Now in keeping with the objects of this invention, the method for forming low-resistance metal local interconnections while retaining the metal over the underlying patterned polysilicon layer to further improve the circuit performance is described in detail. The method is described for making local interconnections for N-channel FETs using an $N^+$ doped polysilicon layer to form the gate electrodes. However, it should be well understood by those skilled in the art that by using additional masking steps and ion implantations that both P- and N-channel FETs, using low sheet resistance local interconnections, can be made on N- and P-doped wells in the substrate, and that complementary metal oxide semiconductor (CMOS) circuits, with improved circuit performance, can be formed therefrom.

Figure 1:
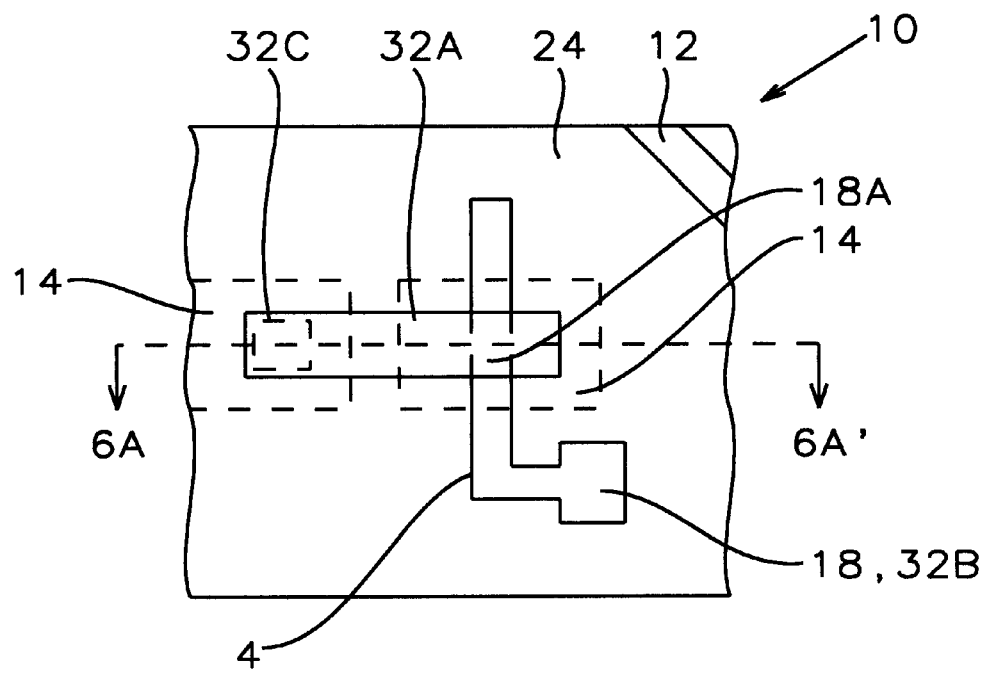
FIG. 1 shows a schematic top view of one possible local interconnection structure after patterning the metal layer.

Referring first to FIG. 1, a top view of a portion of a substrate having one type of local interconnection is shown to better appreciate the invention. Only the key elements of the invention are depicted to simplify the drawing. FIG. 1 shows a P doped silicon substrate 10 having field oxide areas 12 around the active device areas 14. The top view shows the final structure of this invention. A patterned polysilicon layer 18 forms the FET gate electrodes 18A over the device areas, and the patterned polysilicon 18 extends over the field oxide 12 to provide portions of the local interconnection. A silicon oxide ($SiO_2$) layer 24 is formed over the substrate, having recesses 4 in the oxide aligned over and down to the patterned polysilicon layer 18. A metal layer is deposited and patterned to complete the local interconnections 32A. During the patterning of the metal layer, portions of the metal 32B are retained in the recesses 4 over the patterned polysilicon layer 18 to further reduce the electrical resistance and to improve the circuit performance, for example, by reducing the RC time constant. Also shown in FIG. 1 is a metal contact 32C that is concurrently formed when the metal layer is deposited and patterned to complete the local interconnections. The cross section 6A–6A' of the drawings in FIG. 1 is depicted in FIG. 6 for the completed interconnect structure, and FIGS. 2 through 6 show the sequence of process steps.

Figure 2:
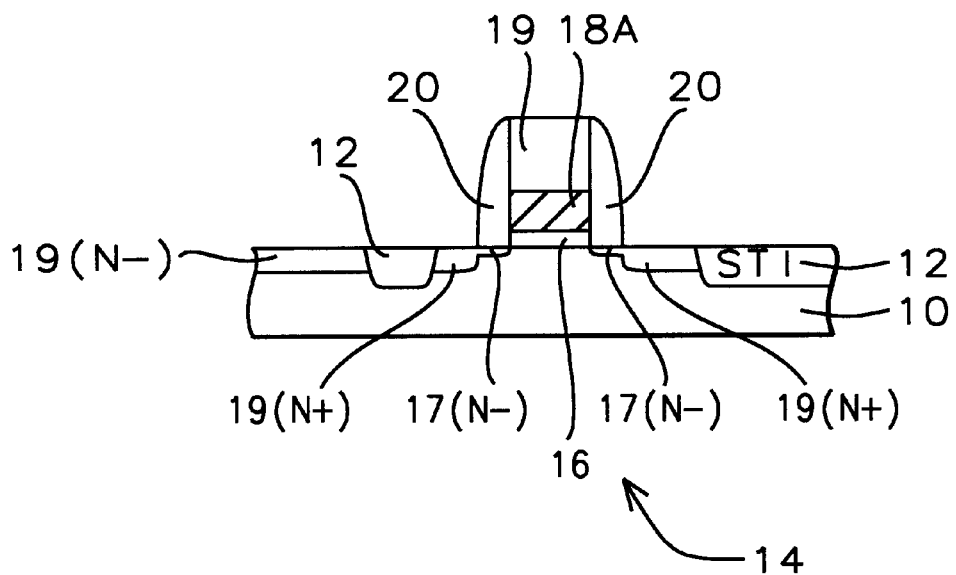
FIGS. 2 through 6 show schematic cross-sectional views through a field effect transistor and a nearby contact to the substrate for the sequence of processing steps for making this local interconnection with improved electrical conductivity by the method of this invention.

Referring now to FIG. 2, the method of forming this improved local interconnection structure is described in detail. FIG. 2 shows a schematic cross-sectional view of the substrate 10 having a partially completed N-channel FET formed on and in the substrate surface. The preferred substrate is composed of a P-type single-crystal silicon having a <100> crystallographic orientation. A Field OXide (FOX) isolation region 12 is formed to surround and electrically isolate the active device areas 14. For the purpose of this invention, the FOX 12 is made planar with the substrate surface, using various methods as commonly practiced in the industry. For example, shallow trench isolations (STI) can be made by etching trenches in the silicon substrate 10, and filled with a CVD $SiO_2$ that is chemically-mechanically polished (CMP) back to the substrate surface. The FOX 12 is typically formed to a thickness of between about 1500 and 4500 Angstroms.

Still referring to FIG. 2, the FETs are now formed in the active device areas 14 by first thermally oxidizing the device regions to form a thin gate oxide 16. The preferred thickness of the gate oxide 16 is between about 25 and 200 Angstroms. Next, a conductively doped polysilicon layer 18 is deposited on the substrate using low-pressure chemical vapor deposition (LPCVD) using, for example, silane ($SiH_4$) as the reactant gas. Layer 18 is deposited to a preferred thickness of between about 150 and 4000 Angstroms. The polysilicon layer 18 is then doped with a conductive dopant using ion implantation, for example, by implanting arsenic ions ($As^{75}$). Alternatively layer 18 can be doped in-situ by introducing a dopant gas. For example, layer 18 can be doped by adding a reactant gas such as arsine ($AsH^3$) or phosphine ($PH^3$) to the $SiH_4$ during deposition. Preferably the dopant concentration of polysilicon layer 18 is between about 1.0 E 19 and 1.0 E 21 atoms/$cm^3$.

Continuing with the process, a first insulating layer 19 composed of silicon nitride ($Si_3N_4$) is deposited on the polysilicon layer 18. Layer 19 is deposited by low-pressure chemical vapor deposition (LPCVD) using dichlorosilane ($SiCl_2H_2$) and ammonia ($NH_3$) as the reactant gases. The $Si_3N_4$ layer 19 is deposited to a thickness of between about 1000 and 3500 Angstroms. The first insulating layer 19 and the polysilicon layer 18 are patterned to form gate electrodes 18A over the device areas 14 and to form portions of the local interconnections over the field oxide isolation regions 12. Layers 19 and 18 are patterned using a photoresist mask and anisotropic plasma etching. The anisotropic etching is carried out using a high-density plasma (HDP) etcher. The $Si_3N_4$ layer 19 can be etched using an etchant gas such as hydrogen bromide (HBr), carbon tetrafluoride ($CF_4$), trifluoromethane ($CHF_3$), methylfluoride ($CH_3F$), or carbon hexafluoride ($C_2F_6$), and the polysilicon layer 18 is etched using an etchant gas such as HBr or chlorine ($Cl_2$).

Still referring to FIG. 2, lightly doped source/drain areas 17($N^-$) are formed next adjacent and aligned to the gate electrodes 18A of the N-channel FET to minimize short-channel effects. The lightly doped source/drain areas 17($N^-$) are formed by ion implanting an N type dopant such as arsenic or phosphorus ions. Next, a conformal second insulating layer 20 is deposited. Layer 20 is preferably composed of $SiO_2$, and is deposited, for example, by LPCVD using a reactant gas such as tetraethosiloxane (TEOS) or TEOS/ozone. The second insulating layer 20 is deposited to a preferred thickness of between about 500 and 2000 Angstroms and is anisotropically etched back to form sidewall spacers 20 on the sidewalls of the gate electrodes 18A. For example, the etchback can be carried out using a reactive ion etcher (RIE) at low pressure using an etchant gas such as $CHF_3$ and $CF_4$. Next, the source/drain contact areas 19($N^+$) are formed by ion implantation adjacent to the sidewall spacers 20. The source/drain contact areas 19($N^+$) are doped with arsenic to a concentration sufficient to provide good ohmic contacts, for example, to a concentration of between about 1.0 E 19 and 1.0 E 21 atoms/$cm^3$.

Figure 3:
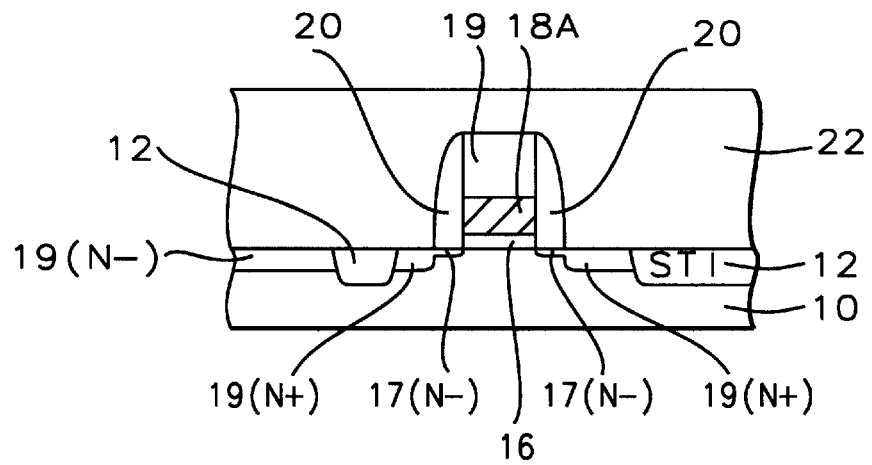

Referring to FIG. 3, a third insulating layer 22 is deposited on the substrate to a thickness that exceeds the total thickness of layers 19 and 18. For example, for the thicknesses of layer 19 and 18 cited above, the thickness of the third insulating layer 22 would be at least greater than 3000 Angstroms. Layer 22 is preferably composed of $SiO_2$ and is deposited by LPCVD using a reactant gas such as TEOS or TEOS/ozone. Alternatively, the third insulating layer 22 can be a doped silicon oxide, such as phosphosilicate glass (PSG) or borophosphosilicate glass (BPSG).

Figure 4:
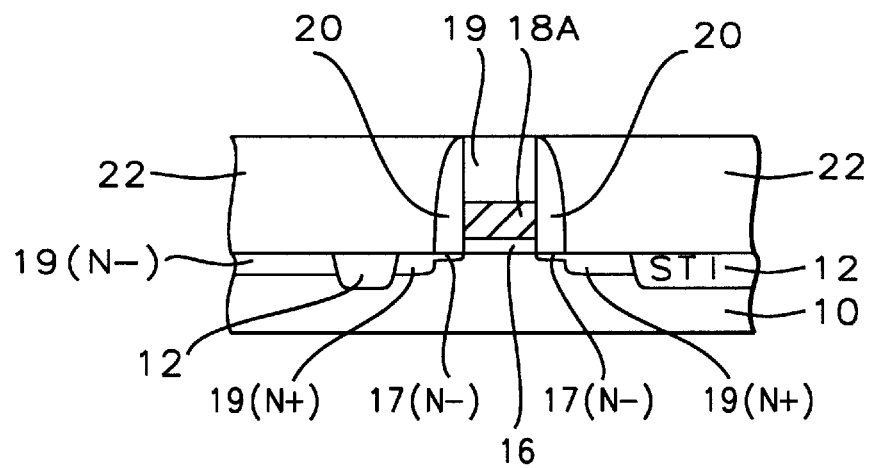

Referring to FIG. 4, the third insulating layer 22 is chemically-mechanically polished (CMP) back to the first insulating layer ($Si_3N_4$) 19 to form a planar surface. The polish-back also exposes the top surface of the $Si_3N_4$ layer 19. The CMP is carried out using an appropriate polishing slurry as commonly practiced in the industry.

Figure 5:
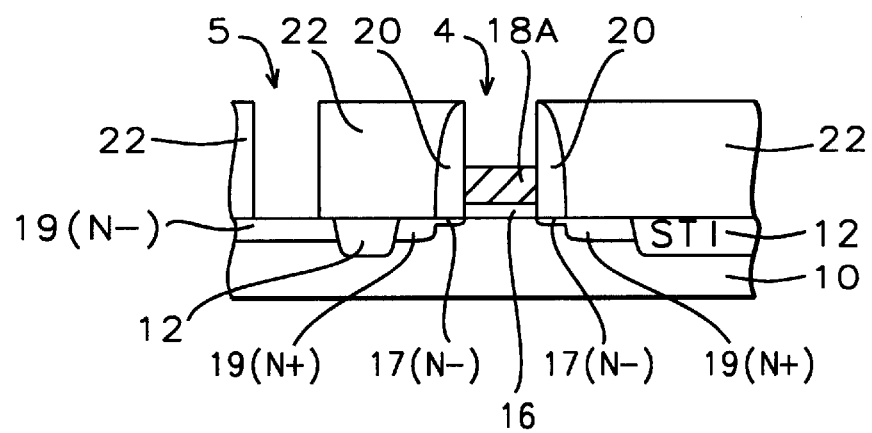
Figure 6:
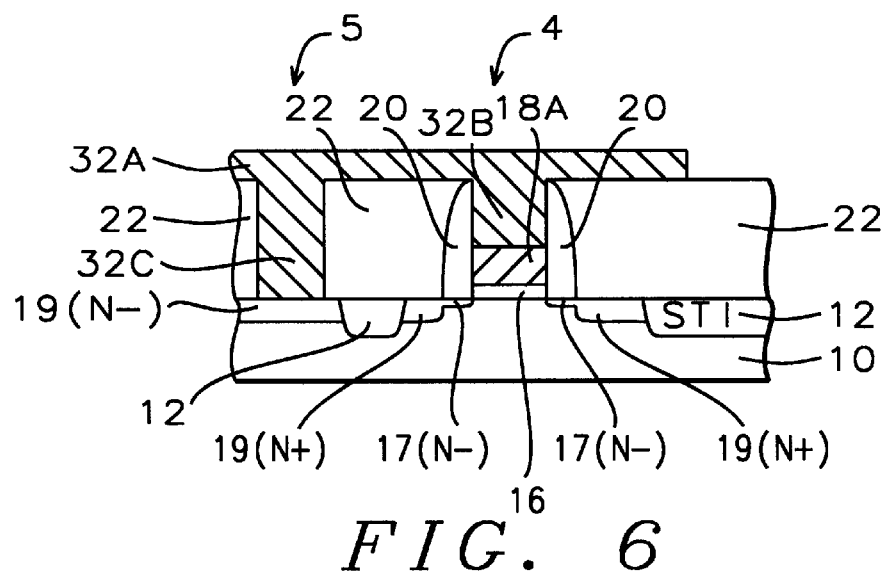

Referring to FIG. 5, by the method of this invention, the $Si_3N_4$ first insulating layer 19 is selectively removed over the patterned polysilicon layer 18. Removing the $Si_3N_4$ 19 results in recesses 4 in the third insulating layer 22. The recesses 4 are aligned over the patterned polysilicon layer 18. Preferably the $Si_3N_4$ is removed by etching in a hot phosphoric acid solution at a temperature of about 160° C., while leaving the second and the third insulating layers 20 and 22, composed of $SiO_2$, essentially unetched.

Still referring to FIG. 5, contact openings 5 are etched in the third insulating layer 22 to the substrate 10 using a photoresist mask and anisotropic etching. The contact openings 5 can be etched using a HDP etcher and an etchant gas that etches the $SiO_2$ selectively to the silicon substrate 10. For example, the etching can be carried out using an etchant gas such as $CHF_3$, carbon monoxide (CO), and oxygen ($O_2$). Alternatively, other etchant gases in various combinations, such as $C_4F_8$, $CH_2F_2$, $C_2F_6$, and $CF_4$, can be used.

Referring to FIG. 6, a barrier/adhesion layer 30 and a high electrical conducting metal layer 32 are deposited consecutively. The barrier layer 30 is deposited to a thickness sufficient to prevent reaction of the metal layer 32 with the silicon substrate 10, thereby preventing degradation of the shallow diffused junctions 19($N^+$) in the contact openings 5. Layer 30 also improves the adhesion properties for bonding of the highly conducting metal layer 32 to the underlying oxide structure. One type of barrier layer is a titanium/titanium nitride (Ti/TiN). For example, the Ti can be deposited by sputter deposition from a Ti target while the TiN can be formed by introducing nitrogen during the sputter deposition. Typically the barrier layer 30 is deposited to a thickness of between about 50 and 1000 Angstroms. Next, a high electrically conducting metal layer 32 is deposited to reduce the electrical resistance and to improve transistor performance. Layer 32 is deposited to a thickness sufficient to fill the recesses 4 and the contact openings 5 and to form an essentially planar surface. More specifically, the metal layer 32 is deposited to a thickness of between about 1500 and 8000 Angstroms. The metal layer 32 can be composed of an electrically conducting material such as tungsten, copper, aluminum, platinum, silver, palladium, or the like.

Still FIG. 6, the metal layer 32 is patterned using a photoresist mask and anisotropic plasma etching to form the local metal interconnections 32A. For example, the metal can be patterned using HDP etching and an appropriate etchant gas mixture, depending on the composition of the metal layer 32. The metal layer 32 is etched down to the top surface of the third insulating layer 22 leaving portions of the metal 32B in the recesses 4 over the polysilicon layer 18A that forms the gate electrode, and elsewhere over the patterned polysilicon layer 18, as depicted in the top view in FIG. 1. This results in improved the electrical conductivity of the patterned polysilicon layer 18 and improves transistor performance. Concurrently the metal layer 32 forms metal contacts 32C in the contact openings 5 to the substrate.

Figure 7A:
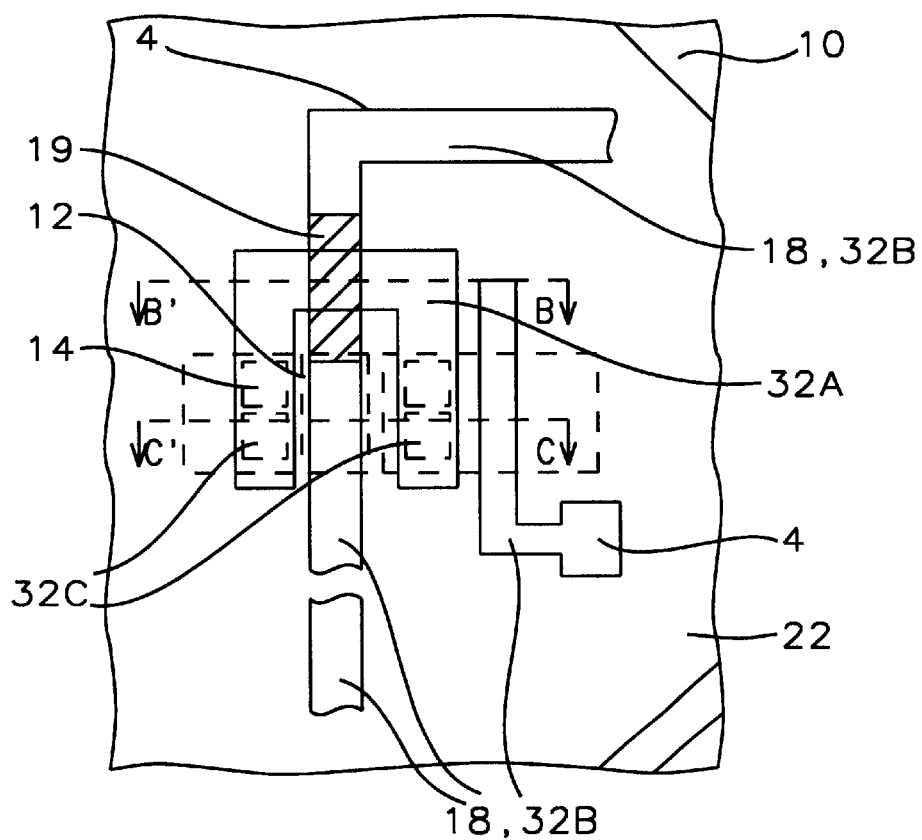
FIG. 7A shows a schematic top view of a local interconnection structure by a second embodiment in which portions of the $Si_3N_4$ insulating layer remain over the patterned polysilicon layer (gate electrodes) to serve as crossovers for the patterned local interconnections.

Referring to FIG. 7A, a top view is shown for a second embodiment of this invention. The process is similar to the first embodiment, and therefore all the elements of the structure are labeled the same as in the first embodiment. After polishing back the third insulating layer 22 (see FIG. 4, first embodiment), an additional photoresist mask step (not shown) is used to pattern the $Si_3N_4$ first insulating layer leaving portions 19 (FIG. 7A) over the patterned polysilicon layer 18 to serve as electrical crossovers. The $Si_3N_4$ first insulating layer is plasma etched using an etchant gas mixture, such as $CHF_3$ and $O_2$. Alternatively other gas mixtures, such as $CHF_3$ and $N_2$, $CH_2F_2$ and $O_2$, and the like, can be used to etch the $Si_3N_4$.

As in the first embodiment, the metal layer 32 is then deposited and patterned by plasma etching down to the too surface of the third insulating layer 22.

Figure 7B:
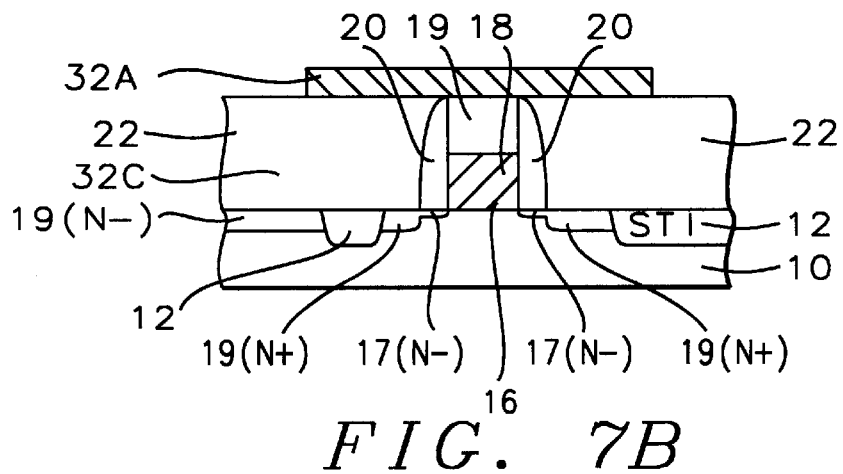
FIG. 7B shows a schematic cross-sectional view through the region B–B' of FIG. 7A for a portion of the metal interconnection over the $Si_3N_4$ insulating layer.
Figure 7C:
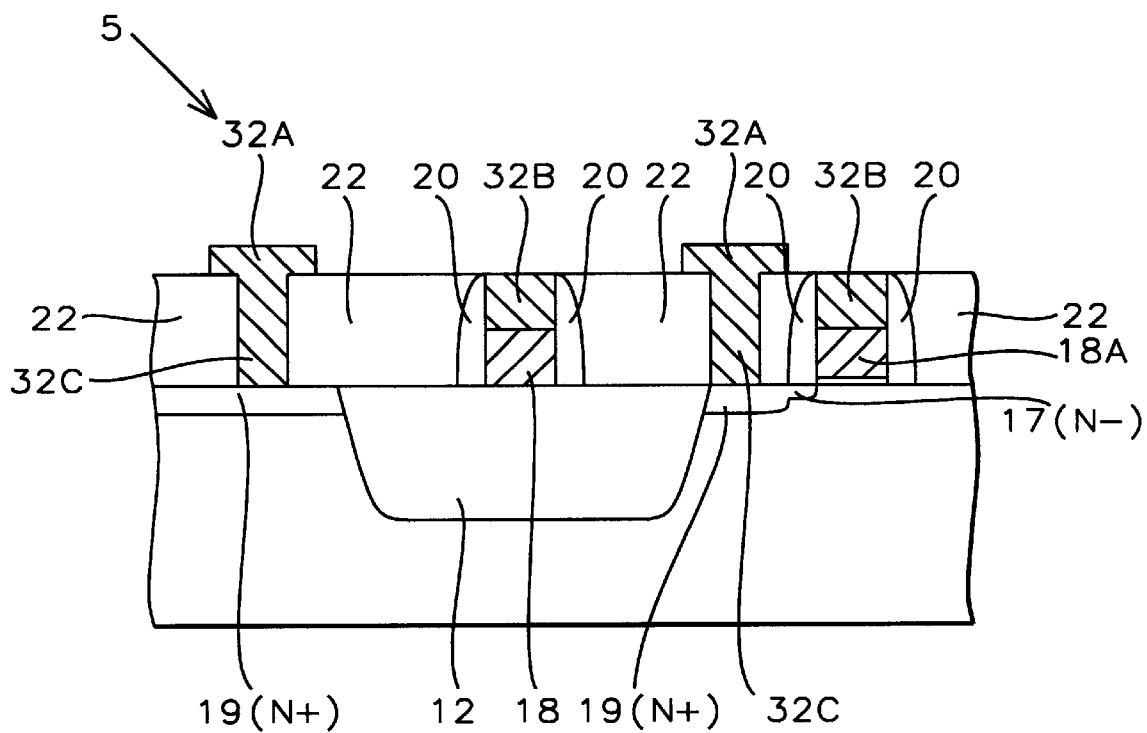
FIG. 7C shows a schematic cross-sectional view through the region C–C' of FIG. 7A for a portion of the metal interconnection through device areas separated by field oxide regions.

FIG. 7B shows a cross section through the region B–B' of FIG. 7A, and FIG. 7C shows a cross section through the region C–C' of FIG. 7A. As shown in FIG. 7B for the cross section through B–B' of FIG. 7A, portions of the metal 32A extend over the $Si_3N_4$ layer 19 to form electrical crossovers for the local interconnections. At the same time, and as shown in FIG. 7C, portions of the metal 32B are retained in the recesses 4 to improve the electrical conductivity of the patterned polysilicon layer 18. Also, during patterning of the metal layer, portions 32C are used to make electrical contacts to the device areas on the substrate.

This novel method results in a local interconnect structure that requires only a single metal layer 32, and therefore is manufacturing cost effective, while increasing the electrical conductivity of the underlying patterned polysilicon layer 18 for improved circuit performance.

While the invention has been particularly shown and described with reference to the preferred embodiments thereof, it will be understood by those skilled in the art that various changes in form and details may be made without departing from the spirit and scope of the invention.

What is claimed is:

1. A method for fabricating local metal interconnections with low contact resistance and gate electrodes with improved electrical conductivity comprising the steps of:

providing a substrate;

forming field oxide isolation regions surrounding and electrically isolating device areas and coplanar with surface of said substrate;

forming a gate oxide on said device areas;

depositing a polysilicon layer on said substrate;

depositing a first insulating layer on said polysilicon layer;

patterning said first insulating layer and said polysilicon layer and leaving portions of said polysilicon layer over said device areas to form said gate electrodes and leaving portions of said polysilicon layer over said field oxide isolation regions for local interconnections;

forming lightly doped source/drain areas adjacent to said gate electrodes by ion implantation;

depositing a conformal second insulating layer over said gate electrodes and elsewhere on said substrate, and anisotropically etching back said second insulating layer thereby forming sidewall spacers on sidewalls of said gate electrodes;

forming source/drain contact areas by ion implantation;

depositing a third insulating layer on said substrate;

polishing back said third insulating layer to said first insulating layer to form a planar surface;

selectively removing portions of said first insulating layer over said portions of said polysilicon layer while leaving essentially unetched said second and said third insulating layers and forming recesses in said third insulating layer over said portions of said polysilicon layer;

using a photoresist mask and anisotropic etching to etch contact openings in said third insulating layer to said substrate;

depositing a unitary blanket metal layer and filling said contact openings and said recesses in said third insulating layer over said portions of said polysilicon layer;

patterning said unitary metal layer leaving portions over said contact openings and over and contacting said portions of said polysilicon layer to complete said local metal interconnections while leaving said metal in said recesses to improve the electrical conductivity of said portions of said polysilicon layer.

2. The method of claim 1, wherein said polysilicon layer is doped with arsenic to a dopant concentration of between about 1.0 E 19 and 1.0 E 21 atoms/$cm^3$.

3. The method of claim 1, wherein said polysilicon layer is deposited to a thickness of between about 150 and 4000 Angstroms.

4. The method of claim 1, wherein said first insulating layer is silicon nitride and is deposited to a thickness of between about 1000 and 3500 Angstroms.

5. The method of claim 1, wherein said second insulating layer and said third insulating layer are silicon oxide.

6. The method of claim 4, wherein said silicon nitride first insulating layer is selectively removed using a hot phosphoric acid etch.

7. The method of claim 1, wherein said contact openings are selectively etched to said substrate using anisotropic plasma etching and an etchant gas mixture composed of trifluoromethane, carbon monoxide, and oxygen.

8. The method of claim 1, wherein said metal layer is a multilayer composed of a titanium/titanium nitride barrier layer and an upper layer of aluminum-copper alloy.

9. The method of claim 1, wherein said metal layer is a multilayer composed of a titanium/titanium nitride barrier layer and an upper layer of copper.

10. The method of claim 8, wherein said titanium/titanium nitride barrier layer is deposited to a thickness of between about 50 and 1000 Angstroms, and said aluminum-copper alloy is deposited to a thickness of between about 1500 and 8000 Angstroms.

11. A method for fabricating local metal interconnections with low contact resistance and gate electrodes with in proved electrical conductivity comprising the steps of:

providing a substrate;

forming field oxide isolation regions surrounding and electrically isolating device areas and coplanar with surface of said substrate;

forming a gate oxide on said device areas;

depositing a polysilicon layer on said substrate;

depositing a first insulating layer composed of silicon nitride on said polysilicon layer;

patterning said first insulating layer and said polysilicon layer leaving portions of said polysilicon layer over said device areas to form said gate electrodes and leaving portions of said polysilicon layer over said field oxide isolation regions for local interconnections;

forming lightly doped source/drain areas adjacent to said gate electrodes by ion implantation;

depositing a conformal silicon oxide second insulating layer over said gate electrodes and elsewhere on said substrate, and anisotropically etching back said second insulating layer thereby forming sidewall spacers on sidewalls of said gate electrodes;

forming source/drain contact areas by ion implantation;

depositing a silicon oxide third insulating layer on said substrate;

polishing back said third insulating layer to said first insulating layer to form a planar surface;

selectively removing portions of said silicon nitride first insulating layer over said portions of said polysilicon layer while leaving essentially unetched said second and said third insulating layers and forming recesses in said third insulating layer over said portions of said polysilicon layer;

using a photoresist mask and anisotropic etching to etch contact openings in said third insulating layer to said substrate;

depositing a unitary blanket metal layer and filling said contact openings and said recesses in said third insulating layer over said portions of said polysilicon layer;

patterning said unitary metal layer leaving portions over said contact openings and over and contacting said portions of said polysilicon layer to complete said local metal interconnections while leaving portions of said unitary metal in said recesses to improve the electrical conductivity of said portions of said polysilicon layer.

12. The method of claim 11, wherein said polysilicon layer is doped with arsenic to a dopant concentration of between about 1.0 E 19 and 1.0 E 21 atoms/cm$^3$.

13. The method of claim 11, wherein said polysilicon layer is deposited to a thickness of between about 150 and 4000 Angstroms.

14. The method of claim 11, wherein said first insulating layer is deposited to a thickness of between about 1000 and 3500 Angstroms.

15. The method of claim 11, wherein said second insulating and said third insulating layers composed of silicon oxide are deposited by low-pressure chemical vapor deposition.

16. The method of claim 11, wherein said first insulating layer composed of silicon nitride is selectively removed using a hot phosphoric acid etch.

17. The method of claim 11, wherein said contact openings are selectively etched to said substrate using anisotropic plasma etching and an etchant gas mixture composed of trifluoromethane, carbon monoxide, and oxygen.

18. The method of claim 11, wherein said metal layer is a multilayer composed of a titanium/titanium nitride barrier layer and an upper layer of aluminum-copper alloy.

19. The method of claim 11, wherein said metal layer is a multilayer composed of a titanium/titanium nitride barrier layer and an upper layer of copper.

20. The method of claim 18, wherein said titanium/titanium nitride barrier layer is deposited to a thickness of between about 50 and 1000 Angstroms, and said aluminum-copper alloy is deposited to a thickness of between about 1500 and 8000 Angstroms.

21. A method for fabricating local metal interconnections with low contact resistance and gate electrodes with improved electrical conductivity comprising the steps of:

providing a substrate;

forming field oxide isolation regions surrounding and electrically isolating device areas and coplanar with surface of said substrate;

forming a gate oxide on said device areas;

depositing a polysilicon layer on said substrate;

depositing a first insulating layer on said polysilicon layer;

patterning said first insulating layer and said polysilicon layer leaving portions of said polysilicon layer over said device areas to form said gate electrodes and leaving portions of said polysilicon layer over said field oxide isolation regions for local interconnections;

forming lightly doped source/drain areas adjacent to said gate electrodes by ion implantation;

depositing a conformal second insulating layer over said gate electrodes and elsewhere on said substrate, and anisotropically etching back said second insulating layer thereby forming sidewall spacers on sidewalls of said gate electrodes;

forming source/drain contact areas by ion implantation;

depositing a third insulating layer on said substrate;

polishing back said third insulating layer to said first insulating layer to form a planar surface;

using a photoresist mask to selectively remove portions of said first insulating layer over said portions of said polysilicon layer while leaving essentially unetched said second and said third insulating layers and forming recesses in said third insulating layer over said portions of said polysilicon layer;

using a photoresist mask and anisotropic etching to etch contact openings in said third insulating layer to said substrate;

depositing a blanket unitary metal layer and filling said contact openings and said recesses in said third insulating layer over said portions of said polysilicon layer;

patterning said unitary metal layer leaving portions over said contact openings and over and contacting said portions of said polysilicon layer to complete said local metal interconnections while leaving said metal in said recesses to improve the electrical conductivity of said portions of said polysilicon layer, and further portions of said patterned unitary metal layer extending over remaining said silicon nitride layer to form crossovers for said local interconnections.

22. The method of claim 21, wherein said polysilicon layer is doped with arsenic to a dopant concentration of between about 1.0 E 19 and 1.0 E 21 atoms/cm$^3$.

23. The method of claim 21, wherein said polysilicon layer is deposited to a thickness of between about 150 and 4000 Angstroms.

24. The method of claim 21, wherein said first insulating layer is silicon nitride and is deposited to a thickness of between about 1000 and 3500 Angstroms.

25. The method of claim 21, wherein said second insulating layer and said third insulating layer are silicon oxide.

26. The method of claim 24, wherein said silicon nitride first insulating layer is selectively removed using a hot phosphoric acid etch.

27. The method of claim 21, wherein said contact openings are selectively etched to said substrate using anisotropic plasma etching and an etchant gas mixture composed of trifluoromethane, carbon monoxide, and oxygen.

28. The method of claim 21, wherein said metal layer is a multilayer composed of a titanium/titanium nitride barrier layer and an upper layer of aluminum-copper alloy.

29. The method of claim 21, wherein said metal layer is a multilayer composed of a titanium/titanium nitride barrier layer and an upper layer of copper.

30. The method of claim 28, wherein said titanium/titanium nitride barrier layer is deposited to a thickness of between about 50 and 1000 Angstroms, and said aluminum-copper alloy is deposited to a thickness of between about 1500 and 8000 Angstroms.

* * * * *